(12) United States Patent
Wong et al.

(10) Patent No.: US 9,891,904 B1
(45) Date of Patent: Feb. 13, 2018

(54) METHOD AND APPARATUS FOR OPTIMIZING IMPLEMENTATION OF A SOFT PROCESSOR EXECUTING A FIXED PROGRAM ON A TARGET DEVICE

(75) Inventors: Jason Wong, Toronto (CA); Gordon Raymond Chiu, Richmond Hill (CA); Deshanand Singh, Mississauga (CA); Valavan Manohararajah, Scarborough (CA)

(73) Assignee: Altera Corporation, San Jose, CA (US)

(*) Notice: Subject to any disclaimer, the term of this patent is extended or adjusted under 35 U.S.C. 154(b) by 1931 days.

(21) Appl. No.: 12/804,880

(22) Filed: Jul. 30, 2010

(51) Int. Cl.
*G06F 9/445* (2006.01)

(52) U.S. Cl.
CPC .................... *G06F 8/65* (2013.01)

(58) Field of Classification Search
CPC ............................................. G06F 8/65
See application file for complete search history.

(56) References Cited

U.S. PATENT DOCUMENTS

| | | | | |
|---|---|---|---|---|
| 7,552,405 | B1* | 6/2009 | James-Roxby | ............... 716/103 |
| 8,402,409 | B1* | 3/2013 | Janneck et al. | ............... 716/117 |
| 2008/0244506 | A1* | 10/2008 | Killian et al. | ................ 717/100 |
| 2008/0256334 | A1* | 10/2008 | Kievits | ................ G06F 9/3017 |
| | | | | 712/205 |
| 2009/0228684 | A1* | 9/2009 | Ramesh et al. | .................. 712/29 |
| 2011/0307688 | A1* | 12/2011 | Nurvitadhi et al. | ........... 712/219 |

OTHER PUBLICATIONS

Tensilica, Inc., Configurable Processors: What, Why, How?, Jun. 2007, Tensilica White Paper, Santa Clara, CA, http://ip.cadence.com/uploads/pdf/Config_Proc_White_Paper.pdf.*
Chang et. al., Logic Synthesis and Circuit Customization Using Extensive External Don't Cares, ACM Transactions on Computational Logic, vol. V, No. N, Jan. 2010, pp. 1-22.*
Yu et. al., Vector Processing as a Soft Processor Accelerator, ACM Journal Name, vol. 0, No. 0, Feb. 2009, pp. 1-31.*

* cited by examiner

*Primary Examiner* — Kurtis Gills
(74) *Attorney, Agent, or Firm* — L. Cho

(57) ABSTRACT

A method for designing a system on a target device includes identifying a soft processor to implement on the target device. The soft processor is optimized in response to code to be executed on the soft processor. Other embodiments are also disclosed.

20 Claims, 15 Drawing Sheets

Processor Instruction Set

| Instruction | Opcode |
|---|---|
| mov | 0 |
| add | 1 |
| mul | 2 |
| div | 3 |
| *illegal* | 4 |

Machine Code

```
0000: mov r0 <- 1
0001: mov r1 <- 2
0002: add r2 <- r1, r2
```

FIG. 4

METHOD AND APPARATUS FOR OPTIMIZING IMPLEMENTATION OF A SOFT PROCESSOR EXECUTING A FIXED PROGRAM ON A TARGET DEVICE

FIELD

Embodiments of the present invention relate to tools for designing systems on target devices. More specifically, embodiments of the present invention relate to a method and apparatus for optimizing implementation of soft processors executing fixed programs on target devices.

BACKGROUND

Target devices such as field programmable gate arrays (FPGAs), structured application specific integrated circuits (ASICs), and ASICs are used to implement large systems that may include million of gates and megabits of embedded memory. The complexity of large a system often requires the use of electronic design automation (EDA) tools to create and optimize a design for the system onto physical target devices. Among the procedures performed by EDA tools in a computer aided design (CAD) flow include hardware description language (HDL) creation for a system and synthesis, placement, and routing of the system on the target device.

Soft processors are among the components that can be implemented on target devices. Soft processors are configurable processor cores that can be implemented on a programmable chip using resources available on the chip. Designers often specify a design for a soft processor to be implemented on the target device prior to developing and finalizing code to be executed on the soft processor. As a result, the soft processor may include hardware that is unused by the program. The unused hardware may take up valuable space on the target device. In addition, soft processors designed prior to finalizing the code to be executed may utilize memory resources on the target device in an inefficient manner.

BRIEF DESCRIPTION OF THE DRAWINGS

The features and advantages of embodiments of the present invention are illustrated by way of example and are not intended to limit the scope of the embodiments of the present invention to the particular embodiments shown.

FIG. 4 illustrates an example of machine code and a processor instruction set according to an embodiment of the present invention.

SUMMARY

A method and apparatus for optimizing implementation of a soft processor executing a fixed program on a target device is disclosed. Upon receiving input from a designer that a program to be executed on the target device is finalized, the code for the program is analyzed to determine program specific optimizations to be made. According to an embodiment of the present invention, unused hardware may be eliminated and/or memory requirements for storing instruction data may be reduced or eliminated. The procedures for optimizing implementation of the soft processor on the target device are automated by a system designer. According to an embodiment of the present invention, the optimizations are achieved using synthesis techniques without modifying the HDL of the soft processor.

DETAILED DESCRIPTION

In the following description, for purposes of explanation, specific nomenclature is set forth to provide a thorough understanding of embodiments of the present invention. It will be apparent to one skilled in the art that specific details in the description may not be required to practice the embodiments of the present invention. In other instances, well-known circuits, devices, and programs are shown in block diagram form to avoid obscuring embodiments of the present invention unnecessarily.

Figure 1:
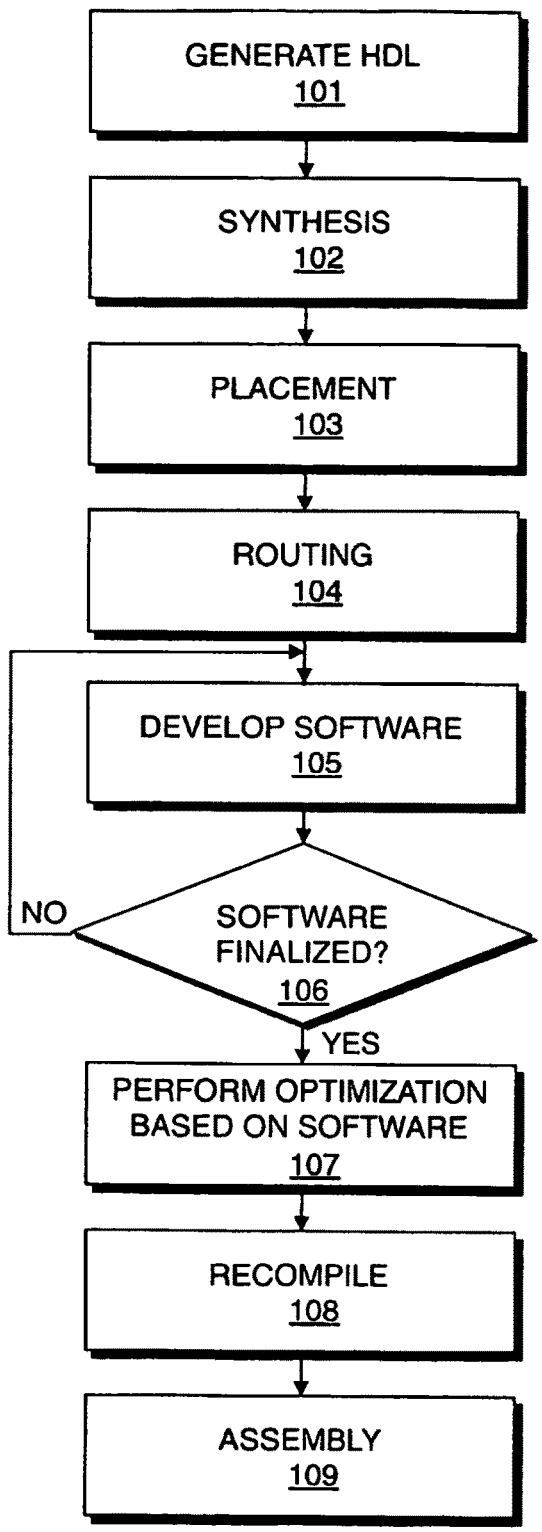
FIG. 1 is a flow chart illustrating a method for designing a system with a soft processor on a target device according to an exemplary embodiment of the present invention.

FIG. 1 is a flow chart illustrating a method for designing a system with a soft processor on a target device according to an exemplary embodiment of the present invention. The procedure described in FIG. 1 allows for an automated analysis of program code to generate program specific optimizations for a soft processor system. The target device may be a field programmable gate array (FPGA), application specific integrated circuit (ASIC), a structured ASIC, or other programmable device. According to one embodiment, the procedure illustrated in FIG. 1 may be performed by a computer aided design (CAD)/electronic design automation (EDA) tool implemented on a computer system. At 101, hardware description language (HDL) design definition is generated to describe the system. The HDL is generated in response to specifications of the system provided by a designer. The specifications may be provided by a designer through a design entry tool. The specifications may describe components and interconnections in the system. For example, available IP blocks may be among the components specified. According to an embodiment of the present invention, a particular type of soft processor is specified by a designer.

At 102, the system is synthesized. Synthesis includes generating a logic design of the system to be implemented by the target device. According to an embodiment of the present invention, synthesis generates an optimized logical representation of the system from the HDL design definition. Synthesis also includes mapping the optimized logic design. Mapping includes determining how to implement logic gates and logic elements in the optimized logic representation with specific resources on the target device. According to an embodiment of the present invention, a netlist is generated from mapping. This netlist may be an optimized technology-mapped netlist generated from the HDL.

At 103, the system is placed. According to an embodiment of the present invention, placement involves placing the mapped logical system design on the target device. Placement works on the technology-mapped netlist to produce a placement for each of the functional blocks. According to an embodiment of the present invention, placement includes fitting the system on the target device by determining which resources on the logic design are to be used for specific logic elements, and other function blocks determined to implement the system as determined during synthesis. Placement may include clustering which involves grouping logic elements together to form the logic clusters present on the target device. According to an embodiment of the present invention, clustering is performed at an early stage of placement and occurs directly after synthesis during the placement preparation stage.

At 104, the placed design is routed. During routing, routing resources on the target device are allocated to provide interconnections between logic gates, logic elements, and other components on the target device. Routability optimization may also be performed on the placed logic design. According to an embodiment of the present invention, the goal of routability optimization is to reduce the amount of wiring used to connect components in the placed logic design. Routability optimization may include performing fanout splitting, logic duplication, logical rewiring, or other procedures. It should be appreciated that one or more of the procedures may be performed on the placed logic design.

At 105, software to be executed by the soft processor is developed. According to an embodiment of the present invention, the software is developed specifically for the soft processor specified at 101. According to an embodiment of the present invention, the actual machine code for the software is compiled and generated.

At 106, it is determined whether the software is finalized. When software is finalized, the software is fixed in the sense that no changes will be made to the code and no additional code would be executed by the soft processor. According to an embodiment of the present invention, the determination is made in response to the designer's input. The designer's input may be received through a graphical user interface. If the software is determined to be finalized, control proceeds to 107. If the software is determined not to be finalized, control returns to 105.

According to an embodiment of the present invention, to ensure that a subsequently modified program is not executed on the soft processor, a checksum is performed on the program code that is finalized. The checksum may be compared with a checksum of program code to be executed on the soft processor at a later time to determine whether the program is the finalized version.

At 107, optimizations are performed on the implementation of the soft processor based on the software. According to an embodiment of the present invention, the software code is analyzed to determine one or more optimization procedures to perform on the system. Based upon the analysis, it may be determined that not all features of the soft processor are needed and/or an instruction memory may be reduced or removed. The optimization procedures may operate to perform instruction filtering, instruction memory compression, instruction memory reduction to a finite state machine (FSM), and/or other optimization procedures. The optimizations may result in a reduction in system size and/or increase in system performance.

At 108, the design for the system is recompiled. According to an embodiment of the present invention, recompilation involves performing synthesis, placement, and routing procedures on the changes to the system resulting from the optimizations performed at 107.

At 109, an assembly procedure is performed. The assembly procedure involves creating a data file that includes information determined by the compilation procedure described by 101-108. The datafile may be a bit stream that may be used to program a target device. According to an embodiment of the present invention, the procedures illustrated in FIG. 1 may be performed by an EDA tool executed on a first computer system. The data file generated may be transmitted to a second computer system to allow the design of the system to be further processed. Alternatively, the data file may be transmitted to a second computer system which may be used to program the target device according to the system design. It should be appreciated that the design of the system may also be output in other forms such as on a display device or other medium. The target device may be programmed with the data file. By programming the target with the data file, components on the target device are physically transformed to implement the system.

According to an embodiment of the present invention, developing software to be executed by a soft processor 105 may be performed any time after specifications of the soft processor is provided by the designer 101. For example, procedure 105 may be performed in parallel with any one of the procedures 102-104. According to an embodiment of the present invention, information about software that is developed and determined to be finalized may be used during synthesis 102, placement 103, and routing 104. In this embodiment, recompilation 108 of the system would not be necessary.

Figure 2:
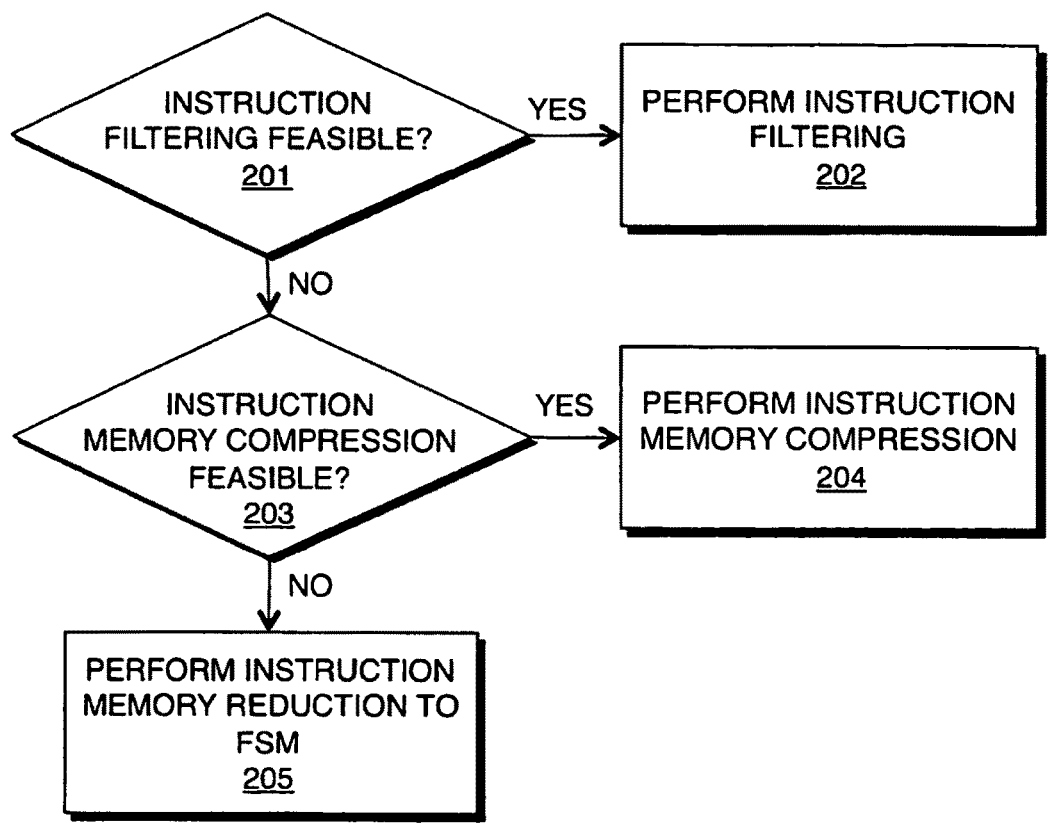
FIG. 2 is a flow chart illustrating a priority scheme for optimizing implementation of a soft processor on a target device according to an embodiment of the present invention.

FIG. 2 is a flow chart illustrating a priority scheme for optimizing implementation of a soft processor on a target device according to an embodiment of the present invention. The procedure illustrated in FIG. 2 may be used to implement procedure 107 illustrated in FIG. 1. At 201, it is determined whether instruction filtering is feasible. Code to be implemented by a soft processor is analyzed to identify instructions supported by the soft processor that are unused. According to an embodiment of the present invention, if a number of unused instructions do not exceed a threshold number or if the unused instructions do not include a set of predetermined instructions, instruction filtering is determined to be infeasible. It should be appreciate that other criteria may be used to determine whether instruction filtering is feasible. If control determines that instruction filtering is feasible, control proceeds to 202. If control determines that instruction filtering is infeasible, control proceeds to 203.

At 202, instruction filtering is performed.

At 203, it is determined whether instruction memory compression is feasible. According to an embodiment of the present invention, instruction memory compression is determined to be feasible when there is a net memory bits savings. Net memory bit savings may be computed by taking an uncompressed size of instructions to be executed (# instructions*# bits per full instruction) and subtracting the compressed instruction data size (# instructions*# bits per compressed instruction) and subtracting a size of memory for supporting decompression of the compressed instruction (# bits in decompression memory). It should be appreciated that other criteria may be used to determine whether instruction memory compression is feasible. If control determines that instruction memory compression is feasible, control proceeds to 204. If control determines that instruction memory compression is infeasible, control proceeds to 205.

At 204, instruction memory compression is performed.

At 205 instruction memory reduction to a finite state machine (FSM) is performed.

According to an embodiment of the present invention, after performing instruction filtering 202, control proceeds to determine whether instruction memory compression is feasible and performs instruction memory compression if the procedure is feasible.

Figure 3:
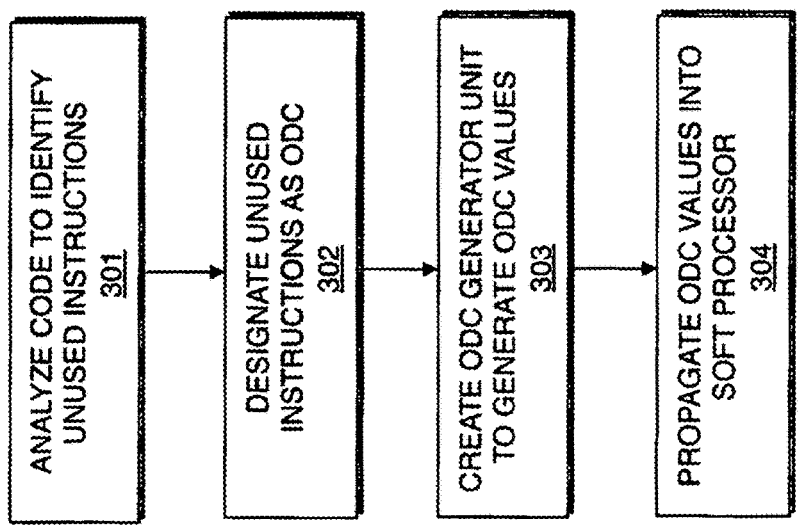
FIG. 3 is a flow chart illustrating a method for performing instruction filtering according to an exemplary embodiment of the present invention.

FIG. 3 is a flow chart illustrating a method for performing instruction filtering according to an exemplary embodiment of the present invention. The procedure illustrated in FIG. 3 may be implemented in whole or in part at procedure 107 shown in FIG. 1 or at 202 illustrated in FIG. 2. At 301, code to be executed by the soft processor is analyzed to identify instructions supported by the soft processor that are used and unused by the code.

At 302, the set of unused instructions identified are designated as observable don't cares (ODC) to the soft processor.

At 303, an ODC generator unit is created to generate ODC values to the soft processor. According to an embodiment of the present invention, synthesizable asserts, a filter block, or other components and mechanisms are used to implement the ODC generator. According to an embodiment of the present invention, a synthesizable assert is a statement represented to a synthesis procedure that states that a signal can be only a certain value.

At 304, the ODC values are propagated into the soft processor. According to an embodiment of the present invention, during recompilation, a synthesis procedure propagates the ODC values into the soft processor to optimize the soft processor's data and control paths.

FIG. 4 illustrates an example of code to be executed by a soft processor and a processor instruction set that is supported by a soft processor according to an embodiment of the present invention. As illustrated in FIG. 4, from the machine code a set of used instructions such as {mov, add} can be identified, and a set of unused instructions {mul, div} can be identified.

Figure 5A:
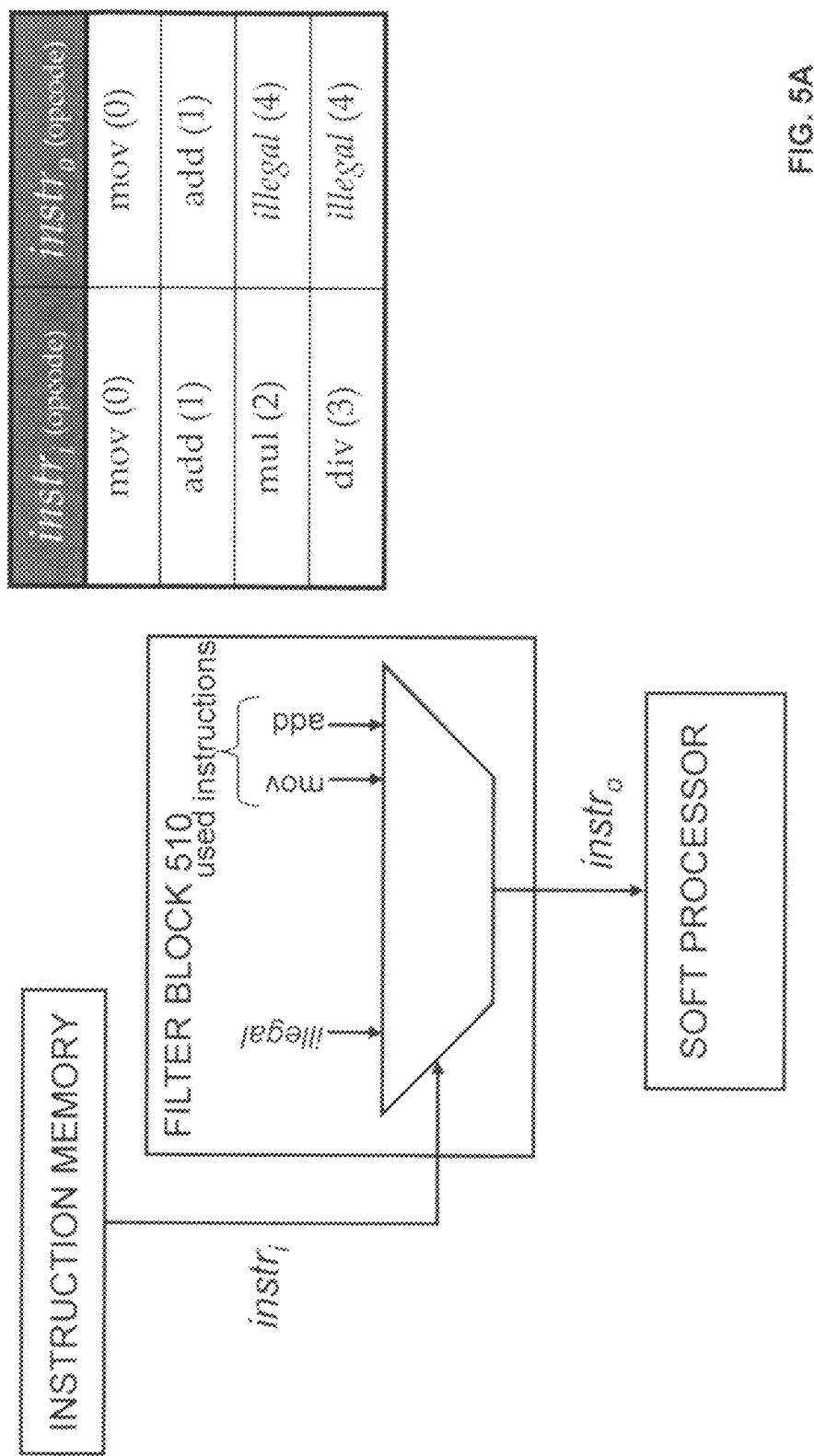
FIGS. 5A and 5B illustrate examples of observable don't care (ODC) generators according to embodiments of the present invention.
Figure 5B:
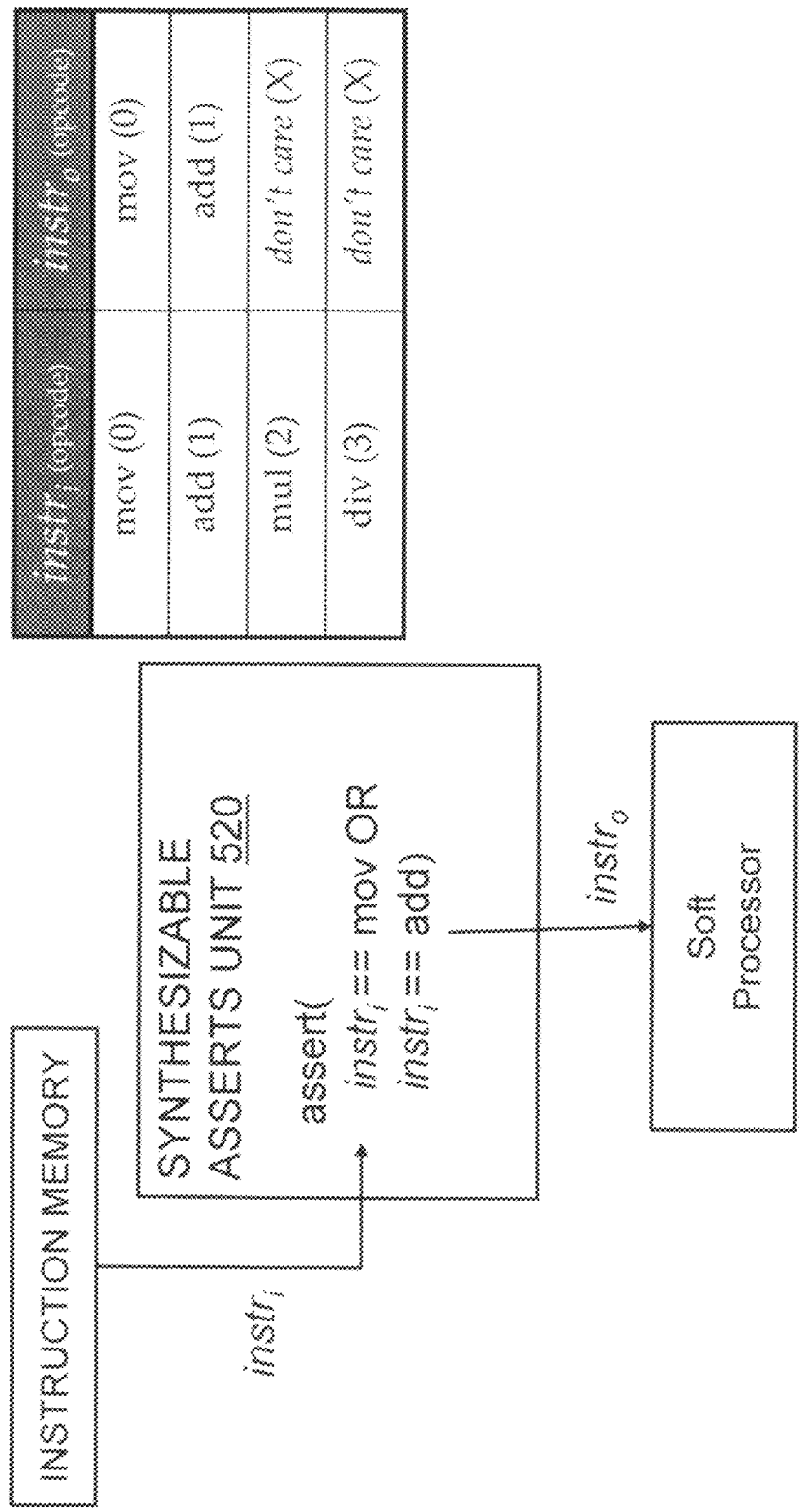

FIG. 5A illustrates an example of an ODC generator unit according to a first embodiment of the present invention. In this example, a filter block 510 is implemented as an ODC generator unit. FIG. 5B illustrates an example of an ODC generator unit according to a second embodiment of the present invention. In this example, synthesizable asserts are implemented as an ODC generator unit. In both FIGS. 5A and 5B, $instr_0$ cannot be a mul(2) or div(3) instruction. With respect to FIG. 5A, instructions mul(2) and div(3) are mapped to illegal (4). With respect to FIG. 5B, instructions mul(2) and div(3) are mapped to don't care states.

Figure 6:
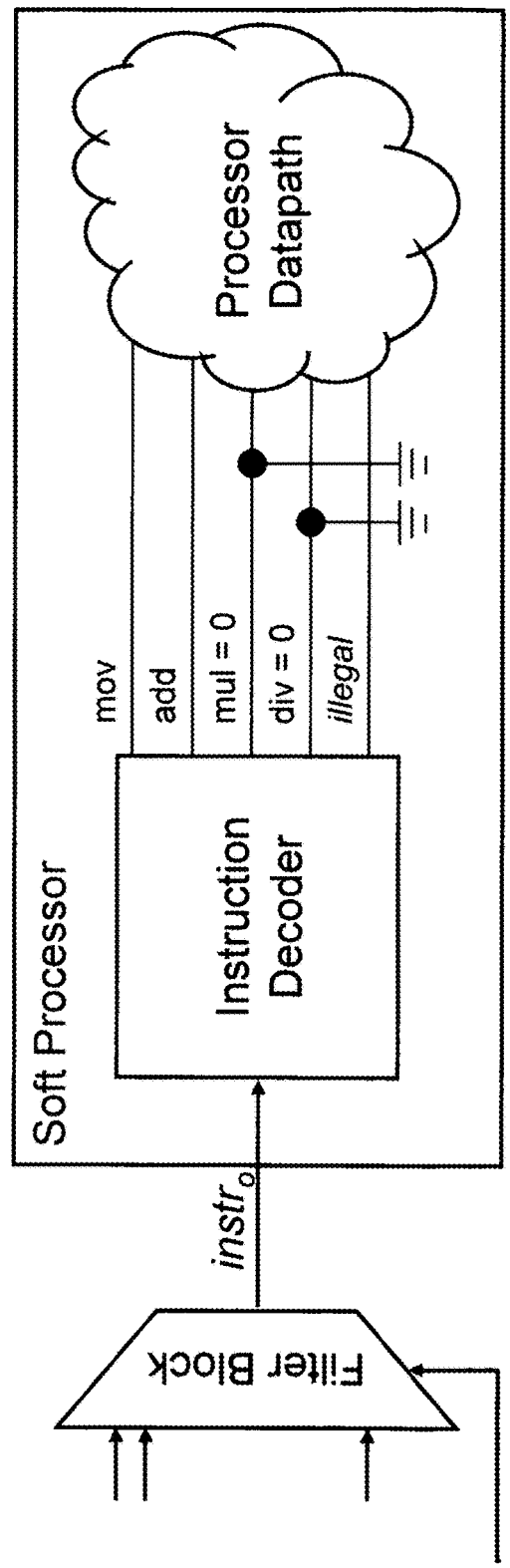
FIG. 6 illustrates an example of a modified soft processor resulting from instruction filtering according to an embodiment of the present invention.

FIG. 6 illustrates an example of a modified soft processor resulting from instruction filtering according to an embodiment of the present invention. A synthesis procedure can generate ODCs when $instr_0$ is a mul(2) or div(3) instruction. The datapath of the soft processor may be simplified through propagation of the ODC values. According to an embodiment of the present invention, the datapath of the soft processor may include components in the soft processor that perform operations such as adders, subtractors, multipliers, shifters, and other components. In this example, multiplication and division logic are eliminated. According to an embodiment of the present invention, the datapath of the soft processor can be implemented using one-hot encoding throughout the pipeline stages.

It should be appreciated that the procedure for instruction filtering may be extended an applied to filter unused registers in the code to reduce the size of a register file, stuck intermediate bits (stuck at 0 or 1) to reduce the width of the data bus in the soft processor, and other components.

Figure 7:
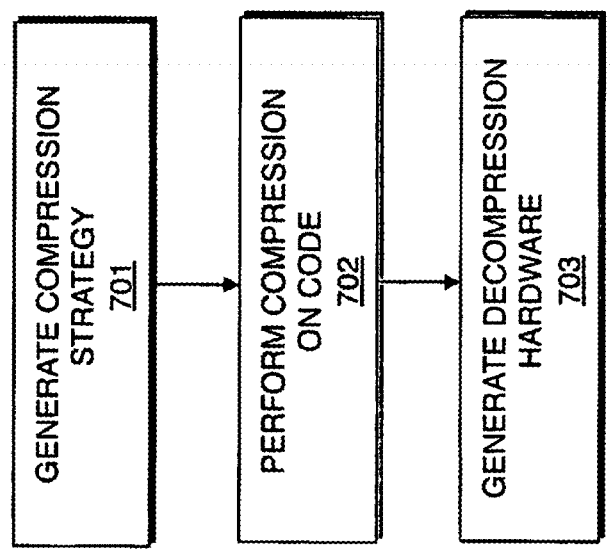
FIG. 7 is a flow chart illustrating a method for performing instruction memory compression according to an exemplary embodiment of the present invention.

FIG. 7 is a flow chart illustrating a method for performing instruction memory compression according to an exemplary embodiment of the present invention. The procedure illustrated in FIG. 7 may be implemented in whole or in part at procedure 107 shown in FIG. 1 or at 204 illustrated in FIG. 2. When implemented at procedure 107, a benefit analysis may be performed similar to the one described at 203 (shown in FIG. 2) to determine whether it would be beneficial to perform instruction memory compression.

According to an embodiment of the present invention, a plurality of different compression schemes may be used in the benefit analysis. The analysis determines a net memory bit savings by taking an uncompressed size of instructions to be executed (# instructions*# bits per full instruction) and subtracting the compressed instruction data size (# instructions*# bits per compressed instruction) and subtracting a size of memory for supporting decompression of the compressed instruction (# bits in decompression memory).

Upon determining that it would be beneficial to perform instruction memory compression from the benefit analysis, control proceeds to 701. At 701, a compression strategy is generated. Each program may have different compression characteristics. Using the results of the benefit analysis performed using a variety of different compression techniques, the most effective compression technique is applied to the code stored in the instruction memory. According to an embodiment of the present invention, it may be determined that in some instances it would be more effective to compress and decompress a portion of each instruction, and that in other instances it may be more effective to compress and decompress an entire instruction.

At 702, compression is performed on the code stored in instruction memory. The instruction memory size may be reduced in response to the compression performed on the code.

At 703, decompression hardware is generated. The decompression hardware may be used to decompress compressed instructions before transmitting the instructions to the soft processor.

Figure 8:
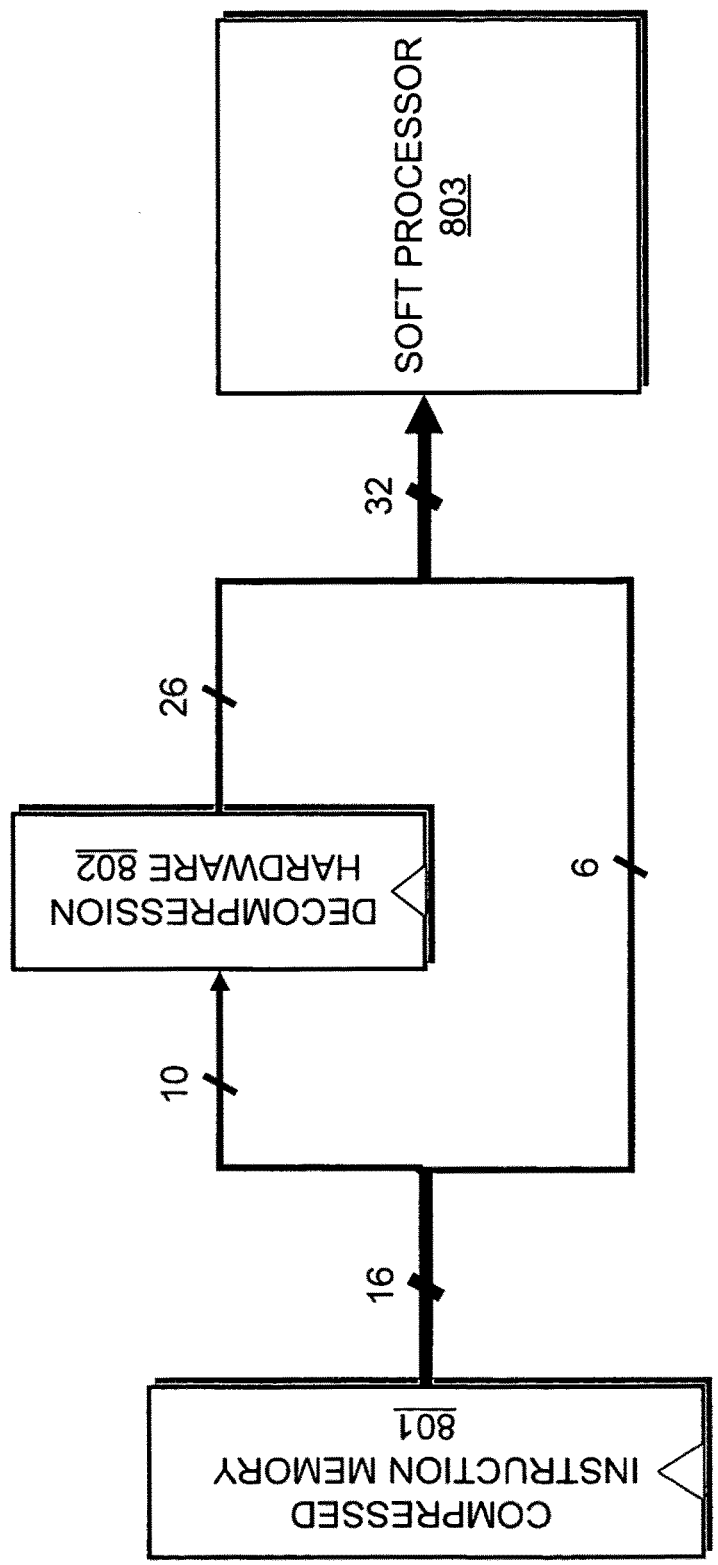
FIG. 8 illustrates an example of a modified system resulting from instruction memory compression according to an embodiment of the present invention.

FIG. 8 illustrates an example of a modified system resulting from instruction memory compression according to an embodiment of the present invention. With the optimizations performed using the procedures in FIG. 7, a two-level instruction memory compression scheme is implemented. The compressed instruction memory 801 stores 16-bits per instructions as oppose to 32-bits per instruction executed by the soft processor 803. The 16 bit instruction includes a 10-bit compressed component and a 6-bit non-compressed component. Decompression hardware 802, expands the 10-bit instruction compressed component to a 26-bit component. The 26-bit component may be combined with its corresponding 6-bit non-compressed component to form a 32-bit instruction.

The instruction memory compression procedure allows various compression techniques to be automatically evaluated on a program and for the most effective procedure to be selected. The instruction memory compression procedure reduces the memory bits required to store machine code. Re-encoding of instructions makes the compression transparent to the soft processor.

Figure 9:
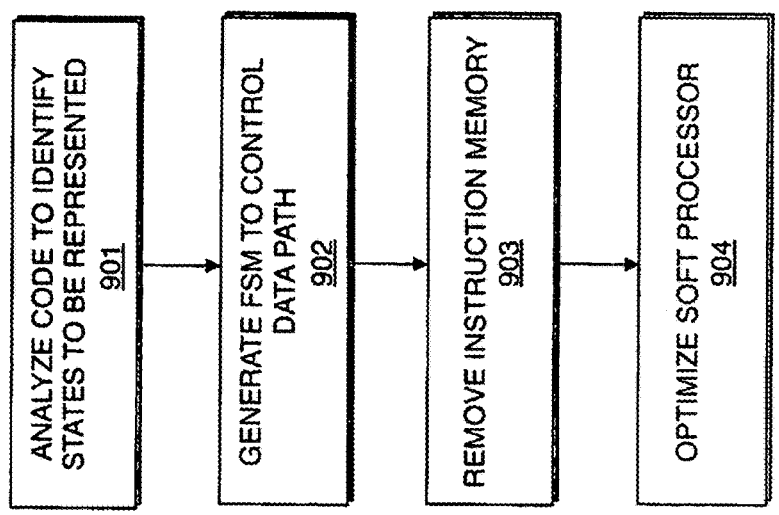
FIG. 9 is a flow chart illustrating a method for performing instruction memory reduction to finite state machine according to an embodiment of the present invention.

FIG. 9 is a flow chart illustrating a method for performing instruction memory reduction to finite state machine (FSM) according to an embodiment of the present invention. The procedure illustrated in FIG. 9 may be implemented in whole or in part at procedure 107 shown in FIG. 1 or at 205 illustrated in FIG. 2. At 901, code to be executed by the soft processor is analyzed to identify states to be represented in a FSM.

At 902, a FSM is generated with the states identified to control the datapath of the soft processor.

At 903, an instruction memory storing the code to be executed by the soft processor is removed from the system.

At 904, the soft processor is optimized. According to an embodiment of the present invention, a synthesis procedure performed during recompilation may be used to remove portions of the datapath that are unused and the datapath may be specialized to simplify and/or speed up the design.

Figure 10:
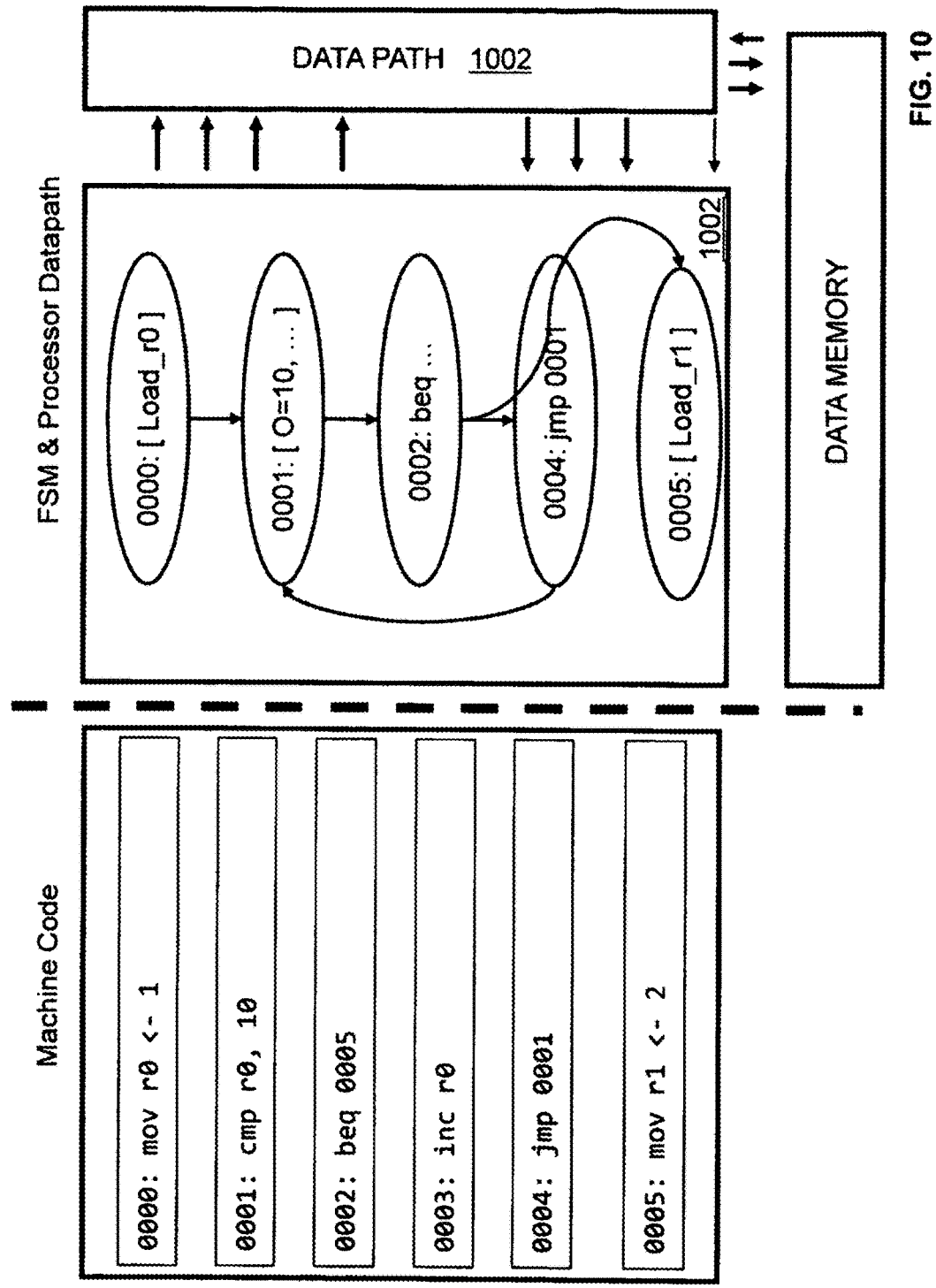
FIG. 10 illustrates an example of machine code and a finite state machine according to an embodiment of the present invention.

FIG. 10 illustrates an example of machine code and a FSM 1001 according to an embodiment of the present invention. The FSM 1001 may be directly coupled to a datapath 1002 of the soft processor. This allows the soft processor to operate without using decoding logic.

The instruction memory reduction to FSM procedure allows the instruction memory to be replaced with registers and logic. Typically, there are fewer memory resources than registers and logic on a target device. Thus, it may be advantageous to conserve memory resources when FSM may be utilized. Utilization of the FSM also allows the soft processor to operate without decoding logic in the soft processor. This allows the datapath of the soft processor to be simplified.

FIGS. 1-3, 7, and 9 are flow charts that illustrate embodiments of the present invention. Some of the techniques illustrated may be performed sequentially, in parallel or in an order other than that which is described and that the procedures described may be repeated. It should be appreciated that not all of the techniques described are required to be performed, that additional techniques may be added, and that some of the illustrated techniques may be substituted with other techniques.

Figure 11:
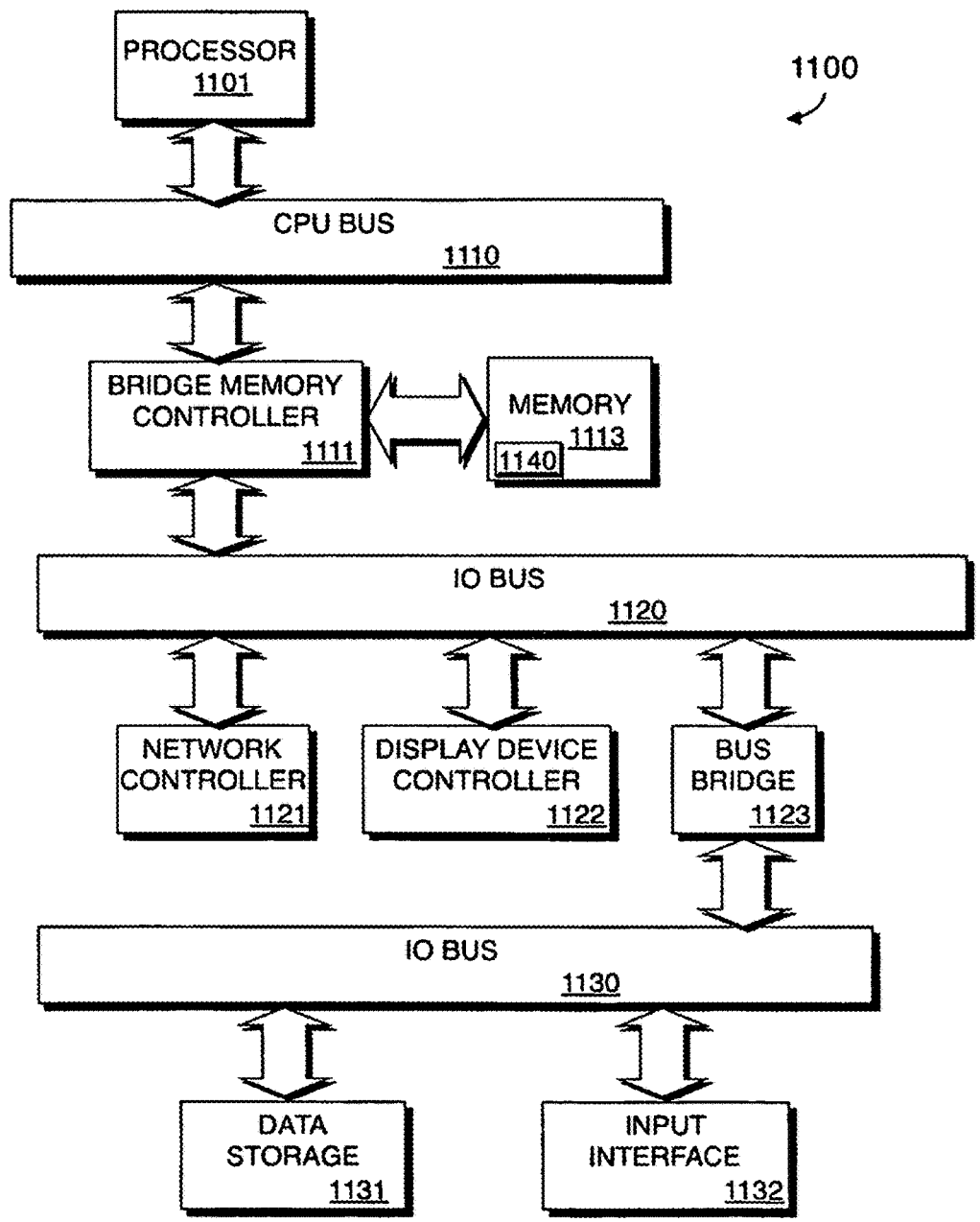
FIG. 11 illustrates a block diagram of a computer system implementing a system designer according to an embodiment of the present invention.

FIG. 11 illustrates a block diagram of a computer system implementing a system designer according to an embodiment of the present invention. As shown, the computer system 1100 includes a processor 1101. The processor 1101 is coupled to a CPU bus 1110 that transmits data signals between the processor 1101 and other components in the computer system 1100.

The computer system 1100 includes a memory 1113. The memory 1113 may be a dynamic random access memory device, a static random access memory device, and/or other memory device. The memory 1113 may store instructions and code represented by data signals that may be executed by the processor 1101. A bridge memory controller 1111 is coupled to the CPU bus 1110 and the memory 1113. The bridge memory controller 1111 directs data signals between the processor 1101, the memory 1113, and other components in the computer system 1100 and bridges the data signals between the CPU bus 1110, the memory 1113, and a first IO bus 1120.

The first IO bus 1120 may be a single bus or a combination of multiple buses. The first IO bus 1120 provides communication links between components in the computer system 1100. A network controller 1121 is coupled to the first IO bus 1120. The network controller 1121 may link the computer system 1100 to a network of computers (not shown) and supports communication among the machines. A display device controller 1122 is coupled to the first IO bus 1120. The display device controller 1122 allows coupling of a display device (not shown) to the computer system 1100 and acts as an interface between the display device and the computer system 1100.

A second IO bus 1130 may be a single bus or a combination of multiple buses. The second IO bus 1130 provides communication links between components in the computer system 1100. A data storage device 1131 is coupled to the second IO bus 1130. The data storage device 1131 may be a hard disk drive, a floppy disk drive, a CD-ROM device, a flash memory device or other mass storage device. An input interface 1132 is coupled to the second IO bus 1130. The input interface 1132 allows coupling of an input device to the computer system 1100 and transmits data signals from an input device to the computer system 1100. A bus bridge 1123 couples the first IO bus 1120 to the second IO bus 1130. The bus bridge 1123 operates to buffer and bridge data signals between the first IO bus 1120 and the second IO bus 1130. It should be appreciated that computer systems having a different architecture may also be used to implement the computer system 1100.

A system designer 1140 may reside in memory 1113 and be executed by the processor 1101. The system designer 1140 may operate to generate HDL design definition for the system, synthesize the system, place the system on a target device, route the system, develop software to be executed on a soft processor of the system, optimize the soft processor, assemble the system, and program a target device to implement the system. According to an embodiment of the present invention, the system designer analyzes the code in the program to be implemented in the soft processor of the system and optimizes the soft processor in response to the analysis of the code.

Figure 12:
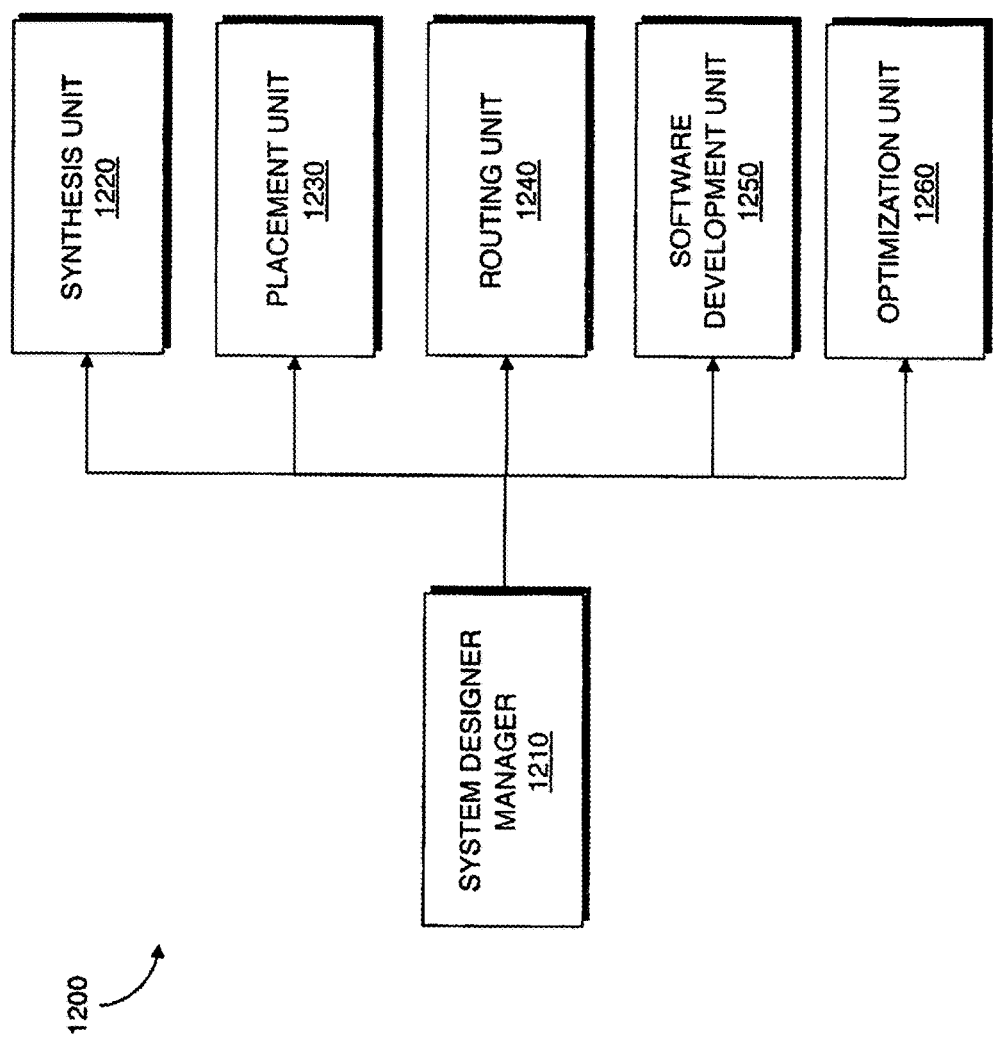
FIG. 12 is a block diagram of a system designer according to an exemplary embodiment of the present invention.

FIG. 12 illustrates a system designer 1200 according to an exemplary embodiment of the present invention. The system designer 1200 may be used to implement the system designer 1140 shown in FIG. 11 and may perform procedures described in FIGS. 1-3, 7 and 9. The system designer 1200 may be a CAD tool for designing a system on a target device. The target device may be, for example, an ASIC, a structured ASIC, an FPGA, a programmable logic device (PLD), a printed circuit board (PCB), or other circuitry. FIG. 12 illustrates modules implementing an embodiment of the system designer 1200. According to one embodiment, system design may be performed by a computer system, such as for example the computer system illustrated in FIG. 11, executing sequences of instructions represented by the modules shown in FIG. 12. Execution of the sequences of instructions causes the computer system to support system design as will be described hereafter. In alternate embodiments, hard-wire circuitry may be used in place of or in combination with software instructions to implement the system designer 1200. Thus, the system designer 1200 is not limited to any specific combination of hardware circuitry and software.

The system designer 1200 includes a system designer manager 1210. The system designer manager 1210 is connected to and transmits data between the components of the system designer 1200. The system designer manager 1210 also generates a HDL design definition to describe the system in response to specifications of the system provided by a designer. The specifications may describe components and interconnections in the system. According to an embodiment of the present invention, a particular type of soft processor may be specified by a designer. The specifications may be provided by a designer through a design entry tool in the form of a graphical user interface provided by the system designer manager 1210.

Block 1220 represents a synthesis unit. The synthesis unit 1220 generates a logic design of a system to be implemented by the target device. According to an embodiment of the system designer 1200, the synthesis unit 1220 takes a conceptual HDL design definition and generates an optimized logical representation of the system. The optimized logical representation of the system generated by the synthesis unit 1220 may include a representation that has a minimized number of functional blocks and registers, such as logic gates and logic elements, required for the system. Alternatively, the optimized logical representation of the system generated by the synthesis unit 1220 may include a representation that has a reduced depth of logic and that generates a lower signal propagation delay. The synthesis unit 1220 also determines how to implement the functional blocks and registers in the optimized logic representation utilizing specific resources on the target device, thus creating an optimized post-synthesis netlist. The post-synthesis netlist indicate how the resources on the target device can be utilized to implement the system. The post-synthesis netlist may, for example, include components such as LEs on the target device.

Block 1230 represents a placement unit. The placement unit 1230 places the system on to the target device by determining which components or areas on the target device are to be used for specific functional blocks and registers. According to an embodiment of the system designer 1200, the placement unit 1230 first determines how to implement portions of the optimized logic design in clusters. Clusters may represent a subset of the components on the logic design. A cluster may be represented, for example, by a number of standard cells grouped together. In this embodiment, after portions of the optimized logic design are implemented in clusters, the clusters may be placed by assigning the clusters to specific positions on the target device. The placement unit 1230 may utilize a cost function in order to determine a good assignment of resources on the target device.

Block 1240 represents a routing unit. The routing unit 1240 determines the routing resources on the target device to use to provide interconnection between the components implementing functional blocks and registers of the logic design.

Block 1250 represents a software development unit. The software development unit 1250 develops software to be executed by the soft processor. The software is developed specifically for the soft processor specified by the designer. According to an embodiment of the present invention, the actual machine code for the software is compiled and generated.

Block 1260 represents an optimization unit. After receiving indication from the system designer manager 1210 that the software is finalized, the optimization unit 1260 performs optimizations on the implementation of the soft processor based on the software. According to an embodiment of the present invention, the software code is analyzed to determine one or more optimization procedures to perform on the system. Based upon the analysis, it may be determined that not all features of the soft processor are needed and/or an instruction memory may be reduced or removed. The optimization unit 1260 may perform instruction filtering, instruction memory compression, instruction memory reduction to a FSM, and/or other optimization procedures. The optimizations may result in a reduction in system size and/or increase in system performance. After optimizations are performed, the design for the system may be recompiled by the synthesis unit 1220, placement unit 1230, and routing unit 1240.

The system designer manager 1210 may also operate to create a data file that includes information determined by the compilation procedure performed by the system designer 1200. The data file may be a bit stream that may be used to program the target device. According to an embodiment of the present invention, the data file generated may be transmitted to another computer system to allow the design of the system to be further processed. Alternatively, the data file may be transmitted to another computer system which may be used to program the target device according to the system design. By programming the target device with the data file, components on the target device are physically transformed to implement the system. It should be appreciated that the design of the system may also be output in other forms such as on a display device or other medium.

Figure 13:
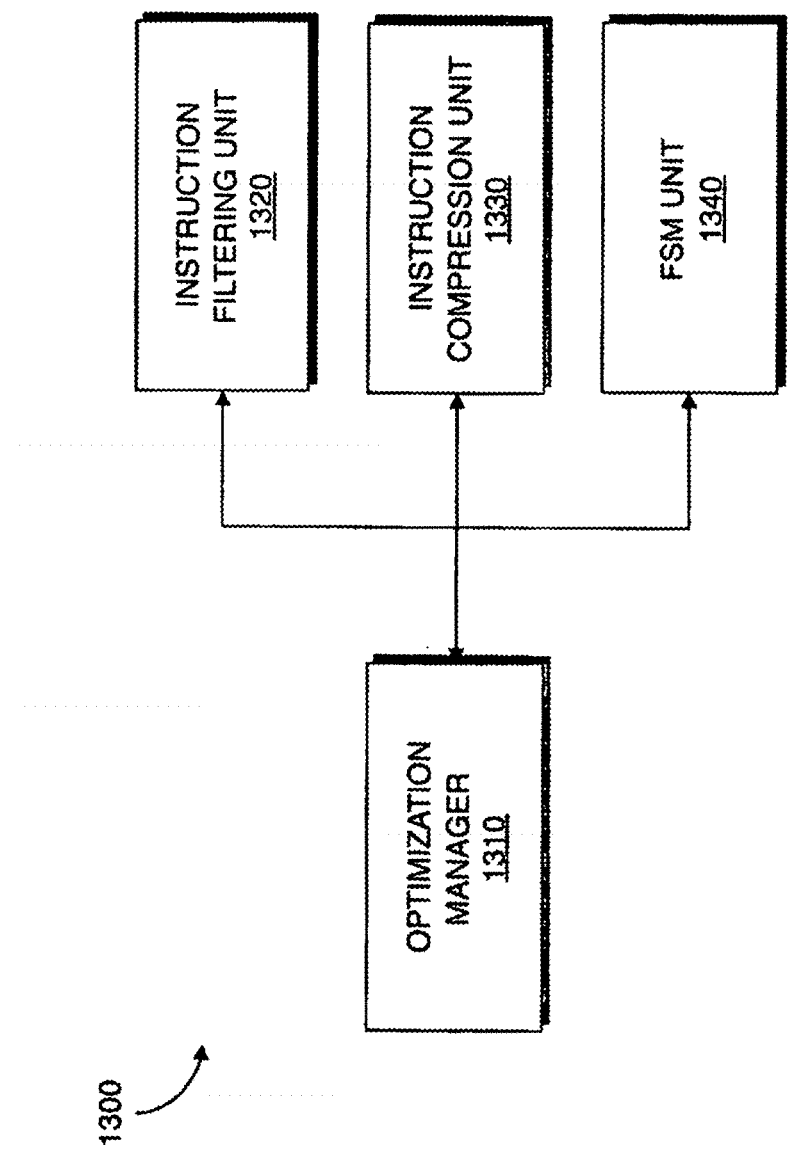
FIG. 13 is a block diagram of an optimization unit according to an embodiment of the present invention.

FIG. 13 is a block diagram of an optimization unit 1300 according to an embodiment of the present invention. The optimization unit 1300 may be used to implement the optimization unit 1260 shown in FIG. 12 and may perform procedures described in FIGS. 2-3, 7 and 9. The optimization unit 1300 includes an optimization manager 1310. The optimization manager 1310 is connected to and transmits data between the components of the optimization unit 1300. According to an embodiment of the present invention, the optimization manager 1310 utilizes a priority scheme, such as the procedure illustrated in FIG. 2, to identify one or more optimization procedures to perform on a design for a system.

Block 1320 represents an instruction filtering unit. The instruction filtering unit 1320 analyzes code to be executed by a soft processor on the target device to identify instructions supported by the soft processor that are used and unused. The unused instructions identified are designated as observable don't cares (ODC) to the soft processor. The instruction filtering unit 1320 creates an ODC generator unit to generate ODC values associated with unused instructions to the soft processor. According to an embodiment of the present invention, synthesizable asserts, a filter block, or other components and mechanisms are used to implement the ODC generator. The ODC values are propagated into the soft processor. According to an embodiment of the present invention, during recompilation, a synthesis procedure propagates the ODC values into the soft processor to optimize the soft processor's data and control paths.

Block 1330 represents an instruction compression unit. Upon determining that it would be beneficial to perform instruction memory compression from a benefit analysis, the instruction compression unit 1330 generates a compression strategy for compressing the instructions stored in an instruction memory. The instruction compression unit 1330 performs compression on the code stored in instruction memory and generates decompression hardware to decompress compressed code prior to transmitting the code to the soft processor.

Block 1340 represents a FSM unit. The FSM unit 1340 analyzes code to be executed by the soft processor on the target device to identify states to be represented in a FSM. The FSM unit 1340 generates an FSM with the states identified to control the datapath of the soft processor and removes an instruction memory storing the code to be executed by the soft processor. According to an embodiment of the present invention, a synthesis procedure performed during recompilation may be used to remove portions of the datapath that are unused and the datapath may be specialized to simplify and/or speed up the design.

It should be appreciated that embodiments of the present invention may be provided as a computer program product, or software, that may include a computer-readable or machine-readable medium having instructions. The instructions on the computer-readable or machine-readable medium may be used to program a computer system or other electronic device. The machine-readable medium may include, but is not limited to, floppy diskettes, optical disks, CD-ROMs, and magneto-optical disks or other type of media/machine-readable medium suitable for storing electronic instructions. The techniques described herein are not limited to any particular software configuration. They may find applicability in any computing or processing environment. The terms "computer-readable medium" or "machine-readable medium" used herein shall include any medium that is capable of storing or encoding a sequence of instructions for execution by the computer and that cause the computer to perform any one of the methods described herein. Furthermore, it is common in the art to speak of software, in one form or another (e.g., program, procedure, process, application, module, unit, logic, and so on) as taking an action or causing a result. Such expressions are merely a shorthand way of stating that the execution of the software by a processing system causes the processor to perform an action to produce a result.

Figure 14:
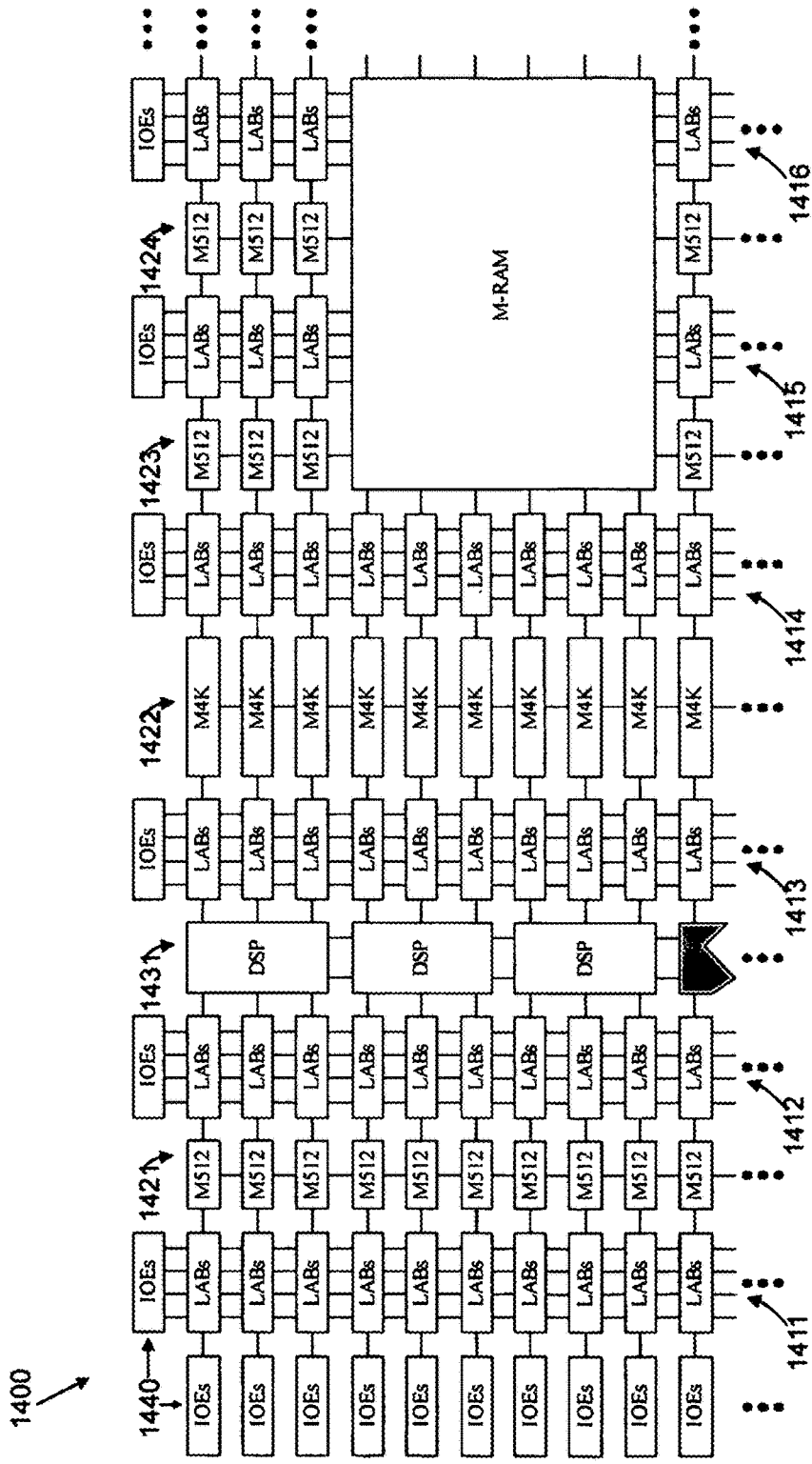
FIG. 14 illustrates an exemplary target device according to an embodiment of the present invention.

FIG. 14 illustrates a device 1400 that may be used to implement a target device according to an embodiment of the present invention. The device 1400 is a field programmable gate array (FPGA) that includes a plurality of logic-array blocks (LABs). Each LAB may be formed from a plurality of logic blocks, carry chains, LAB control signals, look up table (LUT) chain, and register chain connection lines. A logic block is a small unit of logic providing efficient implementation of user logic functions. A logic block includes one or more combinational cells, where each combinational cell has a single output, and registers. According to one embodiment of the present invention, the logic block may operate similarly to a logic element (LE), such as those found in the Stratix or Cyclone devices manufactured by Altera® Corporation, or a combinational logic block (CLB) such as those found in Virtex devices manufactured by Xilinx Inc. In this embodiment, the logic block may include a four input LUT with a configurable register. According to an alternate embodiment of the present invention, the logic block may operate similarly to an adaptive logic module (ALM), such as those found in Stratix devices manufactured by Altera Corporation. LABs are grouped into rows and columns across the device 1400. Columns of LABs are shown as 1411-1416. It should be appreciated that the logic block may include additional or alternate components.

The device 1400 includes memory blocks. The memory blocks may be, for example, dual port random access memory (RAM) blocks that provide dedicated true dual-port, simple dual-port, or single port memory up to various bits wide at up to various frequencies. The memory blocks may be grouped into columns across the device in between selected LABs or located individually or in pairs within the device 1400. Columns of memory blocks are shown as 1421-1424.

The device 1400 includes digital signal processing (DSP) blocks. The DSP blocks may be used to implement multipliers of various configurations with add or subtract features. The DSP blocks include shift registers, multipliers, adders, and accumulators. The DSP blocks may be grouped into columns across the device 1400 and are shown as 1431.

The device 1400 includes a plurality of input/output elements (IOEs) 1440. Each IOE feeds an IO pin (not shown) on the device 1400. The IOEs 1440 are located at the end of LAB rows and columns around the periphery of the device 1400. Each IOE may include a bidirectional IO buffer and a plurality of registers for registering input, output, and output-enable signals.

The device 1400 may include routing resources such as LAB local interconnect lines, row interconnect lines ("H-type wires"), and column interconnect lines ("V-type wires") (not shown) to route signals between components on the target device.

In the foregoing specification, embodiments of the invention have been described with reference to specific exemplary embodiments thereof. It will, however, be evident that various modifications and changes may be made thereto without departing from the broader spirit and scope of the embodiments of the invention. The specification and drawings are, accordingly, to be regarded in an illustrative rather than restrictive sense.

What is claimed is:

1. A method for designing a system on a target device, comprising:
    identifying a soft processor to implement on the target device;
    optimizing the soft processor by identifying instructions supported by the soft processor that are unused by code to be executed on the soft processor, representing the unused instructions as observable don't care (ODC) values, and utilizing synthesis procedures to modify the soft processor in response to the ODC values; and
    recompiling the system in response to the optimizing by performing subsequent synthesis, placement, and routing procedures on the system, wherein at least one of the optimizing and recompiling is performed by a processor.

2. The method of claim 1, wherein optimizing the soft processor is performed in response to a designer indicating that the code is finalized.

3. The method of claim 1, wherein optimizing the soft processor comprises utilizing synthesis procedures on the soft processor without modifying a hardware description language (HDL) description of the soft processor.

4. The method of claim 1, wherein unused instructions are represented by synthesizable asserts.

5. The method of claim 1, wherein unused instructions are represented by a filter block.

6. The method of claim 1, wherein modifying the soft processor comprises reducing control and data paths.

7. The method of claim 1, wherein optimizing the soft processor comprises:
    identifying states to be represented from the code;
    generating a finite state machine; and
    utilizing synthesis procedures to modify the soft processor in response to using the finite state machine to obtain code to be executed.

8. The method of claim 7, wherein modifying the soft processor comprises simplifying data paths.

9. The method of claim 1, further comprising:
compressing the code to reduce a size of an instruction memory on the target device; and
generating hardware to perform decompression of the code on the target device.

10. The method of claim 1, wherein optimizing the soft processor is performed after initial synthesis, placement, and routing procedures are performed on the system.

11. The method of claim 1, further comprising developing the code after the soft processor to be implemented on the target device is identified.

12. A non-transitory computer-readable medium having stored thereon sequences of instructions, the sequences of instructions when executed by a processor causes the processor to perform:
identifying a soft processor to implement on the target device;
performing instruction filtering to optimize the soft processor in response to code to be executed on the processor if instruction filtering is determined to be feasible; and
performing instruction compression on the code to be executed on the processor if instruction filtering is determined to be infeasible.

13. The non-transitory computer-readable medium of claim 12, wherein instruction filtering is determined to be infeasible when a number of instructions that are identified to be unused by the code does not exceed a threshold number.

14. The non-transitory computer-readable medium of claim 12, wherein instruction filtering is determined to be infeasible when instructions that are identified to be unused by the code do not include a set of predetermined instructions.

15. The non-transitory computer-readable medium of claim 12, further comprising instructions which when executed causes the processor to further perform:
determining whether performing instruction compression is feasible; and
generating a finite state machine with states to represent lines of the code when it is determined that instruction compression is infeasible.

16. A system designer, comprising:
a system designer manager to identify a soft processor to implement on a target device;
an optimization unit to optimize the soft processor in response to code to be executed on the processor, wherein the optimization unit comprises an instruction filtering unit that identifies instructions supported by the soft processor that are unused by the code, and represents the unused instructions as observable don't care (ODC) values to allow synthesis procedures to reduce control and data paths in response to the ODC values, wherein at least one of the system designer manager and optimization unit is performed by a processor.

17. The system designer of claim 16, wherein optimizing the soft processor comprises utilizing synthesis procedures on the soft processor without modifying a hardware description language (HDL) description of the soft processor.

18. The system designer of claim 16, wherein the optimization unit comprises a finite state machine unit that identifies states to be represented from the code, and generates a finite state machine to allow synthesis procedures to modify the soft processor in response to using the finite state machine to obtain code to be executed.

19. The system designer of claim 16, wherein the optimization unit comprises a finite state machine unit to compress the code to reduce a size of an instruction memory on the target device, and generate hardware to perform decompression of the code on the target device.

20. The non-transitory computer-readable medium of claim 15, wherein instruction compression is determined to be infeasible when a number of bits saved by compressing instructions in code is less than a number of bits required for instructions for supporting decompression of the code.

* * * * *